United States Patent
Takahashi et al.

[11] Patent Number: 6,101,147
[45] Date of Patent: Aug. 8, 2000

[54] SEMICONDUCTOR MEMORY DEVICE EQUIPPED WITH COLUMN DECODER OUTPUTTING IMPROVED COLUMN SELECTING SIGNALS AND CONTROL METHOD OF THE SAME

[75] Inventors: Shinya Takahashi; Takashi Honda, both of Tokyo, Japan

[73] Assignee: Oki Electric Industry Co., Ltd., Tokyo, Japan

[21] Appl. No.: 08/894,307

[22] PCT Filed: Dec. 25, 1995

[86] PCT No.: PCT/JP95/02658

§ 371 Date: Aug. 18, 1997

§ 102(e) Date: Aug. 18, 1997

[87] PCT Pub. No.: WO97/23877

PCT Pub. Date: Jul. 3, 1997

[51] Int. Cl.[7] .................................................. G11C 8/00
[52] U.S. Cl. ...................... 365/230.06; 365/207; 365/190
[58] Field of Search ............................. 365/230.06, 207, 365/190, 226

[56] References Cited

U.S. PATENT DOCUMENTS

| | | | |
|---|---|---|---|
| 4,344,005 | 8/1982 | Stewart | 365/230.06 X |
| 5,305,261 | 4/1994 | Furutami et al. | 365/189.01 |
| 5,327,386 | 7/1994 | Fudeyasu | 365/189.05 X |

FOREIGN PATENT DOCUMENTS

| | | |
|---|---|---|
| 1-140495 | 6/1989 | Japan . |
| 2-46589 | 2/1990 | Japan . |
| 3-3190 | 1/1991 | Japan . |
| 3-165398 | 7/1991 | Japan . |
| 6-60650 | 3/1994 | Japan . |

*Primary Examiner*—A. Zarabian
*Attorney, Agent, or Firm*—Rabin & Champagne, PC

[57] ABSTRACT

In a semiconductor memory circuit 100 according to the present invention, a column decoder 103 outputs column selecting signals to column lines (CL), whose output part is formed of inverter (125). A driving potential to be supplied to the inverter is set lower than a power supply potential Vcc supplied from outside. With this arrangement, a timing at which a bit line is connected to a data bus is determined by an amplification rate of a potential on the bit line, thereby providing the semiconductor memory device which performs a high speed and reliable operation.

13 Claims, 8 Drawing Sheets

SEMICONDUCTOR MEMORY DEVICE EQUIPPED WITH COLUMN DECODER OUTPUTTING IMPROVED COLUMN SELECTING SIGNALS AND CONTROL METHOD OF THE SAME

BACKGROUND OF THE INVENTION

1. Field of the Invention

The present invention is related to a Dynamic Random Access Memory (DRAM) and, more particularly, to reliable DRAM timing for connecting memory cell data on a bit line to a data bus.

2. Description of Related Art

In the field of semiconductor memory devices, various technological improvements have been promoted and proposed from the view point of a high speed operation and high integration.

An example was disclosed in Japanese Patent Publication: JP-A-3165398 published on Jul. 17, 1991, which aimed at a high speed memory device by improving a column decoder providing a memory cell array with a column selection signal. Another example was disclosed in the U.S. Pat. No. 4,344,005 issued on Aug. 10, 1982, which devised the method of controlling a column decoder.

However, it is an object of the present invention to provide a semiconductor memory device that can perform at higher speed and with more reliable operation by further improving various memory devices which have been proposed and improved.

It is another object of the present invention to provide a semiconductor memory device-which does not hinder a high integration and not complicate the manufacturing process, which memory device can be realized by a simple design.

DESCRIPTION OF THE PREFERRED EMBODIMENT

Best mode for carrying out the present invention will be described hereinafter with reference to the accompanying drawings. The drawings used for this description typically illustrate major characteristic parts in order that the present invention will be easily understood. In this description, one embodiment is shown in which the present invention is applied to a DRAM.

Figure 1:
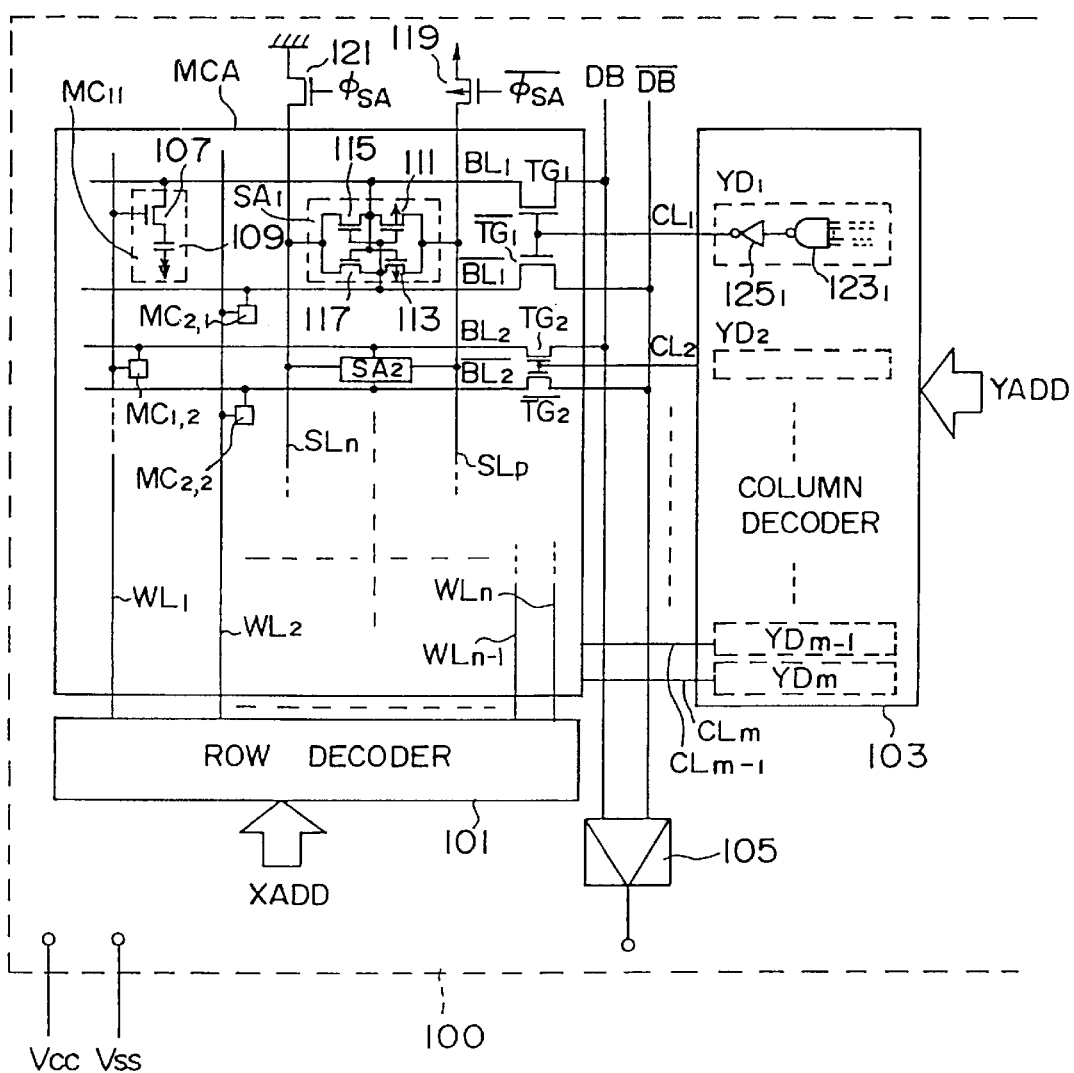
FIG. 1 is a circuit diagram typically and partially illustrating a circuit of a semiconductor memory device according to an embodiment of the present invention.

FIG. 1 is a circuit diagram partially illustrating an outline of a semiconductor memory device according to the present invention.

A semiconductor memory device (DRAM) 100 comprises a plurality of memory cells MCi,j (i=1, 2, ... n, j=1, 2, ... m) to store data, bit line pairs BL1, /BL1~BLm, /BLm each connecting to each memory cells, word lines WL1~WLn for transferring row selection signals that select memory cells, sense amplifiers SA1~SAm for amplifying the potential on each bit line, transfer gate pairs TG1, /TG1,~TGm, /TGm for connecting the bit line pairs to data bus pair DB, /DB in response to column selection signals supplied to column lines CL1~CLm, a row decoder 101 for supplying the row selection signals based on a row address XADD provided from outside, a column decoder 103 for supplying the column selection signals based on a column address YADD provided from outside, and an input output circuit 105 connected to the data bus pair DB, /DB. A power supply potential Vcc and a ground level potential Vss are applied from outside to the memory device 100, and these potentials are used to drive the elements in this memory device. Although the power supply potential Vcc is used to drive the elements in this memory device, it is also known to drive the elements by configuring an internal power supply circuit in this memory device and supplying an internal power supply potential IVcc from the power supply circuit. In replacement of the power supply potential Vcc described in this embodiment, the internal power supply potential IVcc can be used, however, since such substitution can be understood with reference to the following description, the description will herein be omitted.

The memory cell MCi,j is formed of an enhancement type N channel MOS transistor (hereinafter referred to as NMOS) 107 and a capacitor 109. The gate electrode of the NMOS 107 is connected to the word line WLi, the drain electrode of the NMOS 107 is connected to the bit line BLj, the source electrode of the NMOS 107 is connected to the capacitor 109, respectively. The capacitor 109 is connected between the source electrode of the NMOS 107 and a reference potential.

The sense amplifier SAi includes enhancement type P channel MOS transistors (hereinafter referred to as PMOS) 111 and 113, and NMOSs 115 and 117. The gate electrode of the PMOS 111 is connected to the bit line BLi, the drain electrode of the PMOS 111 is connected to the bit line /BLi, and the source electrode of the PMOS 111 is connected to a sense amplifier activating signal supply line SLp, respectively. The gate electrode of the PMOS 113 is connected to the bit line BLi, the drain electrode of the PMOS 113 is connected to the bit line /BLi, and the source electrode of the PMOS 113 is connected to the sense amplifier activating signal supply line SLp, respectively.

The gate electrode of the NMOS 115 is connected to the bit line /BLi, the drain electrode of the NMOS 115 is connected to the bit line BLi, and the source electrode of the NMOS 115 is connected to a sense amplifier activating signal supply line SLn, respectively. The gate electrode of the NMOS 117 is connected to the bit line BLi, the drain electrode of the NMOS 117 is connected to the bit line /BLi, and the source electrode of the NMOS 117 is connected to the sense amplifier activating signal supply line SLn, respectively.

The sense amplifier activating signal supply line SLp, and the sense amplifier activating signal supply line SLn are connected to the power supply potential Vcc and the ground potential Vss through a PMOS 119 and a NMOS 121, respectively. Sense amplifier control signals /ϕSA and ϕSA are supplied to the gate electrodes of the PMOS 119 and NMOS 121, respectively. In response to these control signals, the sense amplifier activating signal supply lines supply the sense amplifier activating signals for activating the sense amplifiers to the sense amplifiers.

This sense amplifier SAi amplifies the potential difference between complementary bit line pairs, BLi and /BLi, during a sensing period (operational period of a sense amplifier) in response to the sense amplifier control signal.

The row decoder 101 decodes the row address XADD supplied from outside and selects a row of the memory cell array MCA. The row decoder 101 supplies a row selection signal to the word line of the row selected out of the word lines from WL1 to WLm.

The column decoder 103 includes a plurality of unit column decoders, YD1 to YDm. Each column decoder 103 decodes a column address YADD supplied from outside and selects a corresponding column of the memory cell array MCA. Each column decoder 103 supplies a column selection signal to a column line of the column selected out of the column lines from CL1 to CLm. The unit column decoder YDi is connected to the column line CLi through an inverter 125$i$ which receives the output from a NAND gate 123$i$, and controls the transfer gates TGi and /TGi.

The transfer gates TGi, /TGi are connected between the data bus DB, /DB and the bit line BLi, /BLi, respectively, and transfers the data on the bit line BLi, /BLi to the data bus DBi, /DBi in response to the column selection signal. The transfer gates TGi, /TGi are formed of NMOSs and the gate electrodes are connected to the inverter 125$i$ of the unit column decoder YDi. A first electrode of the NMOS TGi is connected to the bit line BLi and the second electrode of NMOS TGi is connected to the data bus DBi. A first electrode of NMOS /TGi is connected to the bit line /BLi and the second electrode of the NMOS /TGi is connected to the data bus /DB.

The data bus DBi, /DBi are connected between the transfer gates and the input/output circuit 105 so as to transfer data therebetween.

The input/output circuit 105 receives and distributes data between the memory cell array MCA and an externally connected circuit (not illustrated).

Next, the configuration of an exemplar unit decoder YDi of the column decoder 103 will be described more in detail. Since the column decoder 103 includes of a plurality of essentially identical unit decoders, only the configuration of the unit decoder YDi will be shown typically. The configuration of the other unit decoders and the total configuration of the column decoder will become apparent and easy to understand with reference to the following description.

Figure 2:
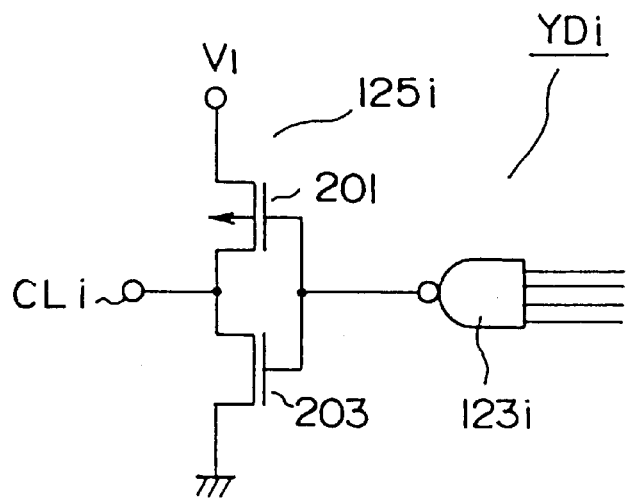
FIG. 2 is a circuit diagram illustrating a configuration of the first type unit decoder applied to a column decoder of the present invention.

FIG. 2 illustrates a first type unit decoder. The inverter 125$i$ of this unit decoder YDi is formed of a PMOS 201 and a NMOS 203, whose input is connected to the output of the NAND gate 123$i$, whose output is connected to the column line CLi. The ground potential is applied to one electrode of the NMOS 203, a driving potential V1 which is lower than the power supply potential Vcc is applied to one electrode of the PMOS 201. Since the application of this driving potential V1 is a characteristic part of the present invention, this point will be described more in detail hereafter.

Figure 3:
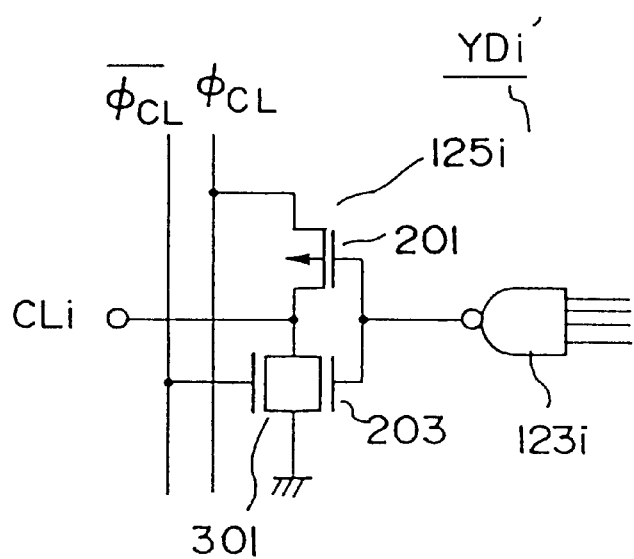
FIG. 3 is a circuit diagram illustrating a configuration of the second type unit decoder applied to a column decoder of the present invention.

FIG. 3 illustrates a second type unit decoder. In this unit decoder YDi', a NMOS 301 is connected in parallel to the NMOS 203 of the inverter 125$i$. Further, a column decoder control signal ϕCL is supplied to one electrode of the PMOS 201. A column decoder control signal /ϕCL, the inverted signal of the column decoder control signal ϕCL, is supplied to the gate electrode of the NMOS 301. The column decoder 103 is controlled by the column decoder control signals ϕCL, /ϕCL.

Although the first type unit decoder is applied in the column decoder 103 of the semiconductor memory device illustrated in the foregoing FIG. 1, the first type unit decoder can be easily replaced by the second type unit decoder.

Figure 4:
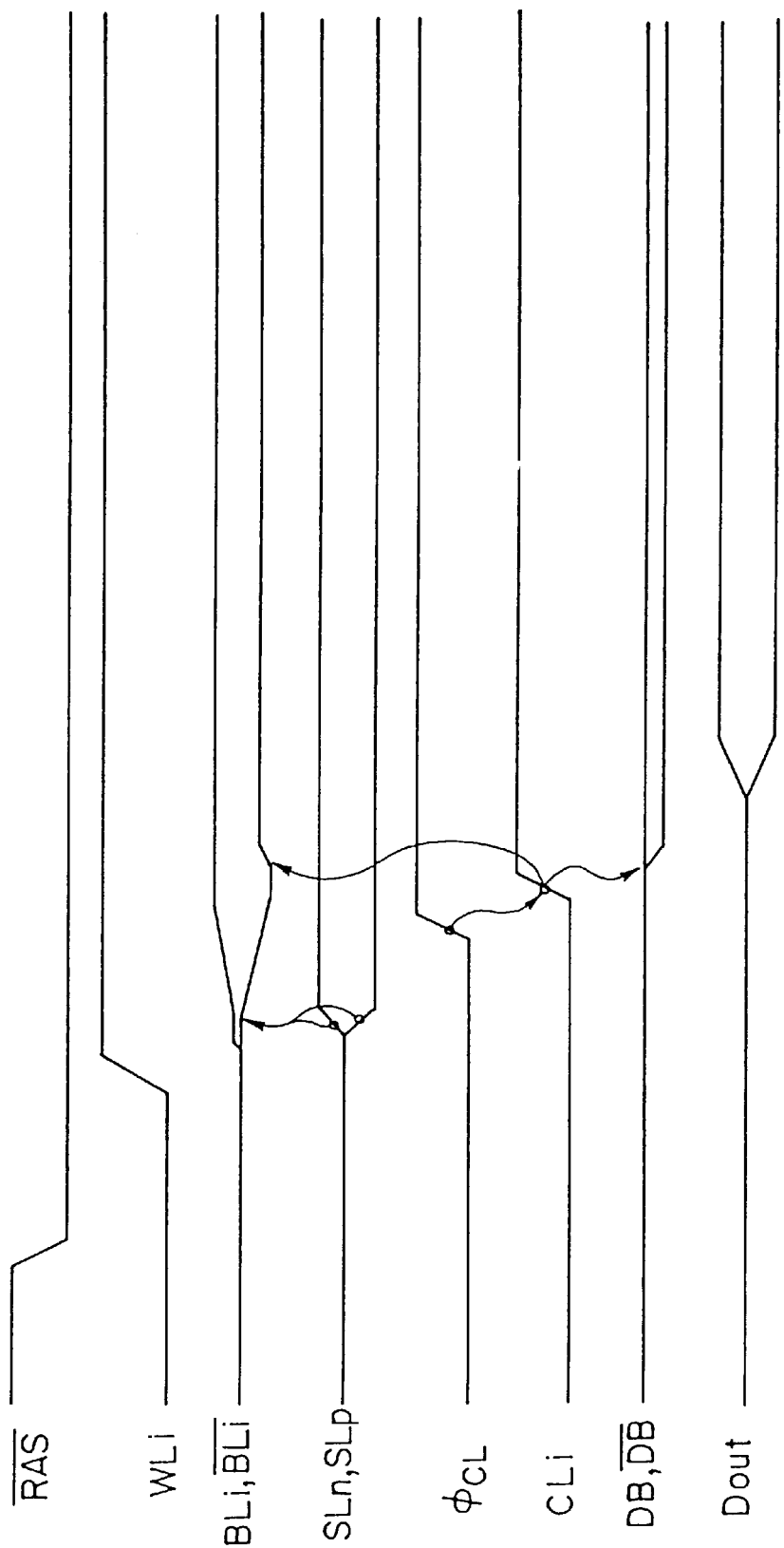
FIG. 4 is a timing chart partially illustrating an outline of operation of the semiconductor memory device shown in FIG. 1.

Here, the outline of total operation of the semiconductor memory device illustrated in FIG. 1 will be described briefly with reference to the timing chart shown in FIG. 4. The detailed description of the operation relating to the column decoder that forms a characteristic part of the present invention will be omitted herein for an easy understanding of the present invention. The omitted part in this description will be clearly understood with reference to the descriptions, described later. In FIG. 4, a timing chart is illustrated in a case where the foregoing second type unit decoder is applied, however, the basic operation is substantially the same as a case where the foregoing first type unit decoder is applied. In that case, assumption of a timing chart excluding the waveform of the column control signal ϕCL in this timing chart will lead to an easy understanding of the operation of the semiconductor memory to which the first type unit decoder is applied.

First, when a Row Address Strobe (RAS) signal supplied to the semiconductor memory device from outside becomes a Low level, the semiconductor memory device is activated. Next, the row decoder 101 decodes the row address XADD supplied from outside and supplies the row selection signal to the word line WLi of the row selected out of the word lines from WL1 to WLm. And then, the data stored in a memory cell connected to the WLi appears in a potential variation of the bit line pair BLi, /BLi.

Next, when the sense amplifier control signals ϕSA, /ϕSA are supplied, the sense amplifier SAi is activated, and the potentials of the bit line pair BLi, /BLi are amplified. Thereafter, the column decoder control signal ϕCL is supplied to activate the column decoder 103. The column decoder 103 decodes the column address YADD supplied from outside and supplies the column selection signal to the column line CLi of the column selected out of the column lines from CL1 to CLm. Consequently, the transfer gates TGi, /TGi open, and the data bus pair DB, /DB are connected to the bit line pair BLi, /BLi, leading to transferring the potentials of the bit line pair to the data bus pair. Thereafter, the potentials of the data bus pair DB, /DB are further amplified by the input output circuit 105, and output as data from an output terminal Dout. Thus, the data stored in the memory cell are read out.

In the foregoing case, although only the data readout operation is described, the data write operation will be omitted herein, since it will be easily understood by persons skilled in the art with reference to the foregoing description of the operation.

Next, the unit decoder will be described which has been suspended so far.

First, as shown in FIG. 2, the potential V1 is applied to one electrode of the PMOS 201 in the inverter 125$i$ of the first unit decoder YDi and is set to a lower potential than the power supply potential Vcc, which will be described with reference to the drawings.

Figure 5:
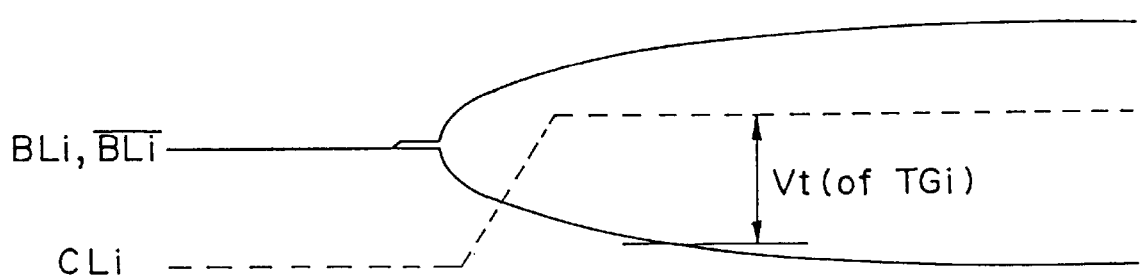
FIG. 5 is a chart explaining a potential relation between a column selection signal and a bit line according to the present invention.

In the DRAM circuit of the present invention, the driving potential V1 is set as described above, and consequently the potential of the column selection signal output from the column decoder becomes lower. Therefore, as shown in FIG. 5, even if a column of the memory cell array MCA is selected by the column address YADD and a column selection signal is supplied to the column line CLi of the column, the transfer gate will not turn on until one of the potential of the bit line BLi or /BLi (bit lines are precharged to half of the power supply potential Vcc, HVcc) which is to be amplified to a Low level becomes lower than the potential V1 of the column selection signal by the threshold voltage Vt of transistors forming the transfer gate TGi, /TGi.

In other words, the transfer gate in the semiconductor memory device of the present invention does not turn on coincident with the column selection signal being supplied, but the transfer gate turns on at a time corresponding to the potential of the bit line by monitoring the potential of the bit line. In the present invention, the time at which the bit line is connected to the data bus is determined by the amplification rate of the potential of the bit line.

Figure 6:
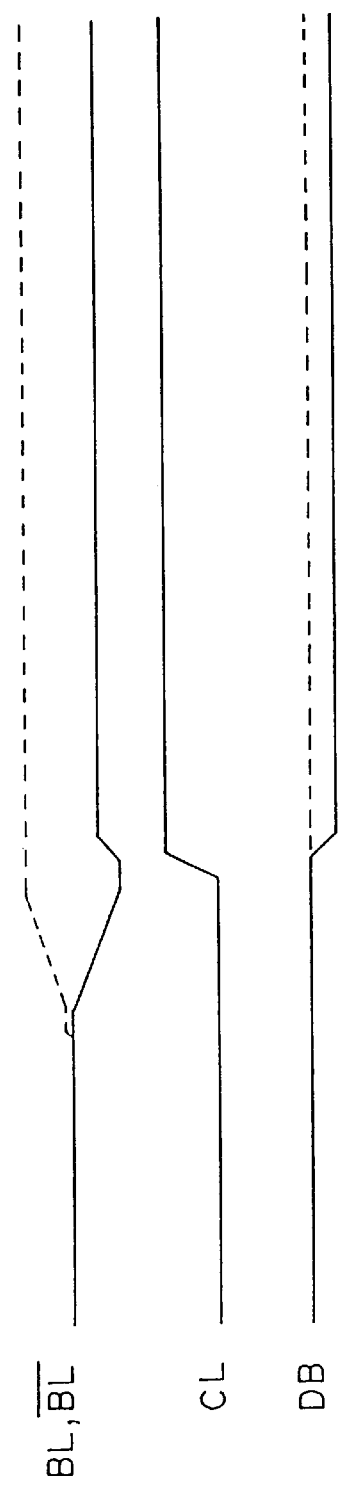
FIG. 6 is a chart explaining a potential relation of a bit line, a column line, and a data bus.

Normally, in a DRAM circuit, when a column selection signal is supplied to a transfer gate through a column line, the transfer gate immediately turns on and connects a bit line to a data bus as shown in FIG. 6. In this case, the bit line and data bus are precharged in a general precharging method.

Figure 7:
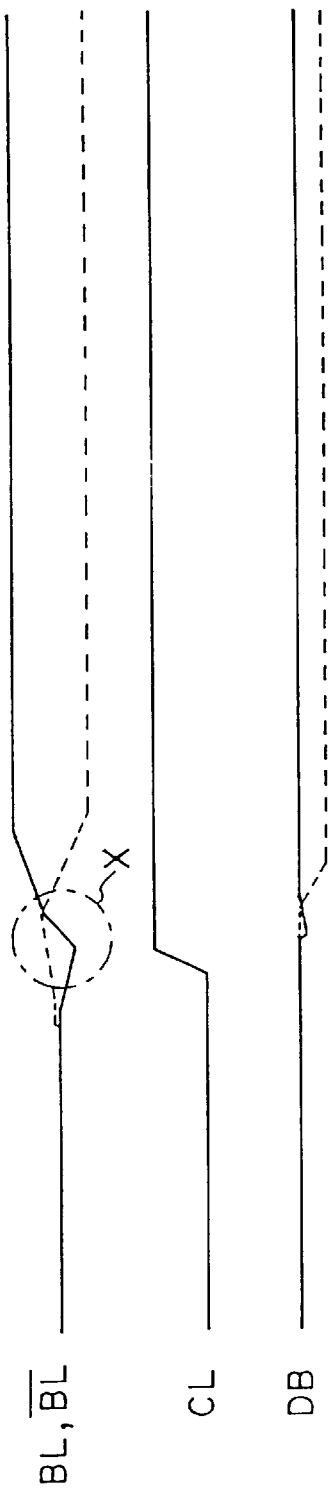
FIG. 7 is a chart explaining another potential relation of a bit line, a column line, and a data bus.

It is possible to prematurely connect a bit line to a data bus while data is still being sensed and before the bit line is sufficiently amplified, that is, while the amplifying operation is in progress, in order to pursue a higher DRAM access speed. However, since the typical data bus capacitance may be several times or even tenfold that of the bit line, prematurely connecting the bit line to the data bus could result in enough charge flowing from the data bus to the bit line from the data bus to destroy the signal on the bit line as represented in FIG. 7 (see the encircled period labeled X). This result hinders high-speed DRAM development.

Whereupon, even if the timing relationship of the column selection signal and the time at which the bit line is connected to the data bus are to be reliably controlled, that reliability is impaired by the nonuniformity of the memory device fabrication process. Alternatively, setting a sufficient design margin in the timing to insure the proper relationship, becomes an obstacle to a high speed operation due to process variations. Also, providing a control circuit at the periphery of the memory cell array to properly controlling the timing, is an impediment to achieving high integration. The circuit density in the area surrounding the memory cell array is extremely high, and including such a control circuit in such an area impairs density even though it may contribute to memory performance.

On the other hand, in the exemplary embodiment in which the present invention is in a DRAM, the bit line is connected to the data bus by an amplification rate proportional to the bit line potential. In other words, the bit line is automatically connected to the data bus on the basis of the potential monitored on the bit line. Therefore, the timing relationship of the connection of the bit line is to the data bus is always properly maintained. Accordingly, with respect to the connection timing of the bit lines to the data bus lines, the timing is naturally optimized for highest speed and most reliable performance. Further, the present invention does not require additional complicated circuits or a complicated production process to maintain this relationship and can be realized in a standard circuit design using a current production process without impeding high integration.

The Driving Potential V1

Let VB be defined as the ideally amplified potential of the bit line, when the bit line is connected to the data bus. Then, the transfer gate may be disposed to turn on at the time when the bit line potential is amplified from the initial potential HVcc to the ideal potential VB by setting the potential of the column selection signal output at the column decoder to "VB+Vt" (Vt: threshold voltage of transistors forming the transfer gate). This means that, even if the amplifying operation on the bit line does not reach a sufficient level when the select voltage is applied to the transfer gate, then, when the transfer gate of the present invention turns on does not depend on the column selection signal timing at the column decoder output, but is determined by the voltage potential relationship between the transfer gate and the bit line.

Accordingly, also in the case of the second type unit decoder YDi' shown in FIG. 3, the timing of turning on the transfer gate can easily be understood with reference to the foregoing description. In this case, the column decoder control signal φCL is supplied to one electrode of the PMOS 201 in the inverter 125$i$. The potential of the column decoder control signal φCL is set to the driving potential V1. Since this case is described in a later described embodiment, it will be better understood with reference to that embodiment.

Figure 8:
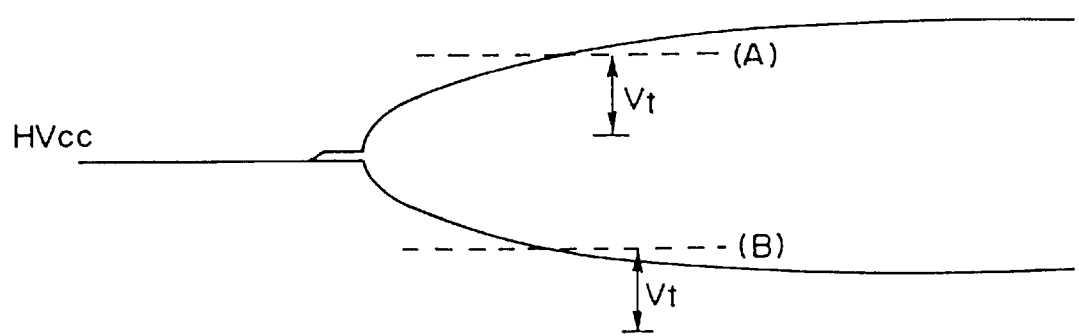
FIG. 8 is a chart explaining a setting range of a driving potential.

Next, the range of driving potential V1 may be understood with reference to FIG. 8. It should be noted for the preferred embodiment that the bit line is precharged to HVcc, half of the power supply potential Vcc, and the threshold voltage of the transfer gate transistor is Vt.

First, in FIG. 8 the dashed line labeled A shows a case where the driving potential V1 is greater than HVcc+Vt. In this case, the transfer gate transistor turns on regardless of the potential of the bit line such that the foregoing timing sensitivity is not necessarily avoided. Therefore, the upper range limit is defined by V1≦HVcc+Vt. Further, as represented by the dashed line labeled B, by setting the driving potential V1 below Vt, the transfer gate transistor is always off, preventing the transfer gate from functioning as a switch. Therefore, the relation "V1≧Vt" is the second boundary condition for the driving potential V1.

Therefore, taking these boundary conditions into consideration, the driving potential V1 range satisfies the relationship Vt≦V1≦(HVcc+Vt). That is, the driving potential V1 range is lower than the potential (HVcc+Vt), i.e., the sum of bit line precharge potential HVcc and the transfer gate threshold transistor voltage Vt; and, is higher than the gate transistor threshold voltage Vt.

Referring again to the highlighted portion of FIG. 7, labeled X, the inventor of the present invention discovered that such data destruction on the bit line does not occur so readily when the bit line is connected to the data bus after the potential of the bit line is amplified to Vcc/3. So, taking the amplification rates of the bit line amplified toward the High side and the bit line amplified toward the Low side of the bit line pair as identical, the following equation can be derived:

$$V1 = HVcc - (Vcc/3)/2 + Vt_o$$

Substituting the following typical operating conditions for current general DRAMs in this equation, the following results are obtained:

(1) when Vcc=5 v, HVcc=2.5 v, Vt=0.8 v are given, V1 is 2.46 v, and (2) when Vcc=3 v, HVcc=1.5 v, Vt=0.6 v are given, V1 is 1.6 v.

Thus, the driving potential V1 in both cases is about half of the external power supply potential Vcc, that is, a potential close to HVcc, which represents an ideal condition.

Selecting the driving potential V1 to be half of the Vcc, i.e., HVcc, makes it possible to utilize the locally available supply lines supplying HVcc, already available on the chip for supplying the precharge potential. Since these precharge potential lines are normally located out in the vicinity of the memory cell array, providing HVcc to the DRAM circuit can be easily realized without significant additional layout which might otherwise impact density or impair high speed and reliable operation. Thus, by means of a very simple design modification of current sense amplifier circuit wiring, this high quality DRAM circuit can be easily produced without substantially increasing the manufacturing process. This is an economic advantage to a manufacturer who has already made a huge investment in producing semiconductor memory devices.

Next, the improvement of the write operation in which data are written onto the memory cell array will be described. In the preferred write operation the output potential of this type of column decoder, that is, the potential V1 of the column selection signal supplied to the column signal line, is set to a potential close to half of the external power supply potential Vcc, i.e., HVcc.

By fixing the driving potential V1 to half of the external power supply potential Vcc, i.e., HVcc, the maximum gate potential of the transfer gate transistor is HVcc, and hence, the impedance of the bit line and data bus are increased. Accordingly, this could cause a write time increase.

Figure 9:
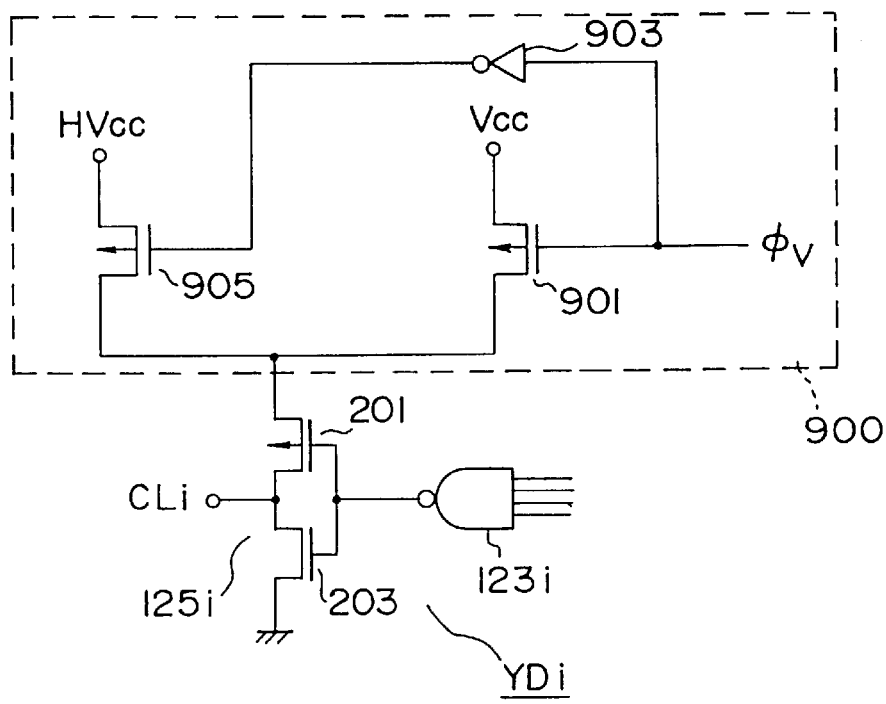
FIG. 9 is a circuit diagram partially illustrating an example in which a power supply switching circuit is applied to the semiconductor memory device according to the present invention.

To avoid such a possibility, a power supply switching circuit 900 may be disposed on one electrode of the PMOS 201 as shown in FIG. 9.

This power supply switching circuit 900 which switches the power supply in response to a power supply selection signal $\phi$V. The power supply switching circuit 900 includes a PMOS 901 and an inverter 903 to which the power supply selection signal $\phi$V is applied. A second PMOS 905 to is driven by the output of inverter 903.

One electrode of PMOS 901 is connected to the full power supply potential Vcc, the other electrode is connected to the source electrode of PMOS 201; wherein when the power supply selection signal $\phi$V is in a Low level, the power supply potential Vcc is supplied to the unit decoder YDi through PMOS 901.

One electrode of the PMOS 905 is connected to the potential HVcc, half of the power supply potential Vcc, and the other electrode is connected to the source electrode of the PMOS 201; wherein when the power supply selection signal $\phi$V is in a High level, the power supply potential Vcc is supplied to the unit decoder YDi through PMOS 905.

Thus, since the power supply potential Vcc is supplied to the unit decoder YDi in a write operation when the power supply selection signal $\phi$V is at a Low level, the output potential of the column decoder is driven to the full power supply potential Vcc level. Further, since half of the power supply potential Vcc, i.e., HVcc is supplied to the unit decoder YDi in a readout operation when the power supply selection signal $\phi$V is at a High level, the output potential of the column decoder will become the HVcc, and hence the foregoing characteristic effect of the present invention can be achieved.

Thus, when the write time has been increased to improve read operation reliability, the power switching circuit 900 may be included to remove the write time delay that may otherwise be an obstacle to the high speed operation, thereby achieving the performance and reliability improvements obtained by the present invention.

FIG. 9 shows a case to which the first type unit decoder of FIG. 2 is utilized. However, application to the second type unit decoder of FIG. 3 also may be easily understood with reference to the foregoing description.

Figure 10:
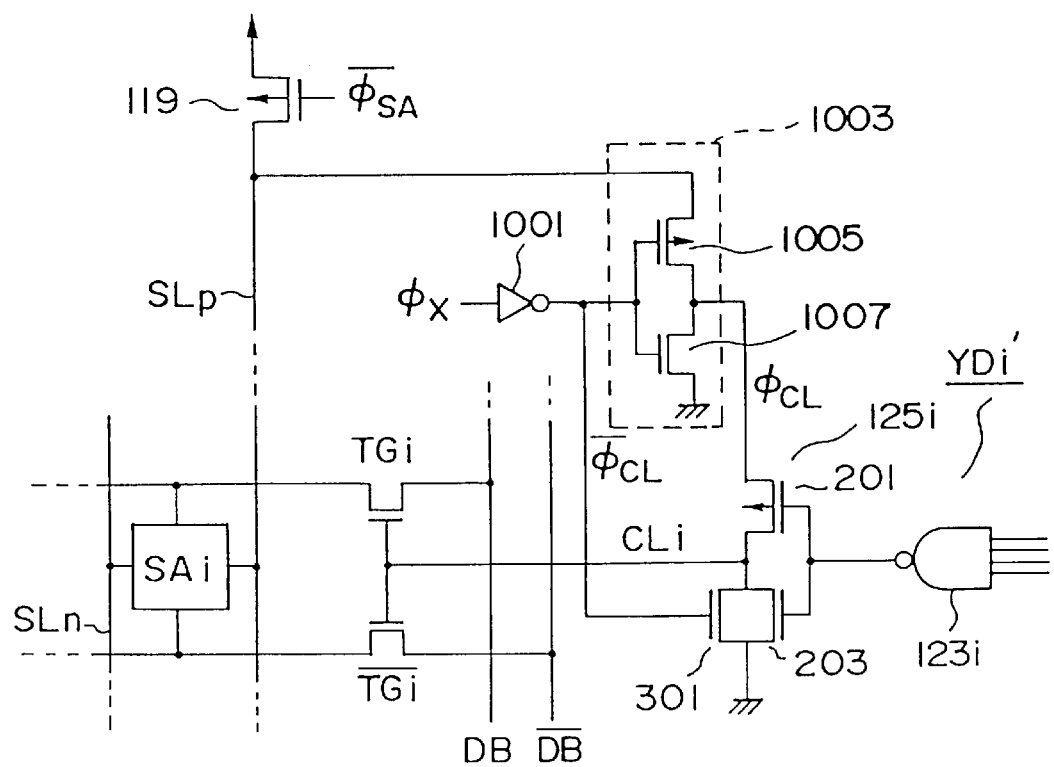
FIG. 10 is a circuit diagram partially illustrating another embodiment of the present invention.

Next, with reference to FIG. 10, a yet another embodiment is described. In the foregoing embodiments, high speed operation was achieved using a power supply switching circuit to compensate for an anticipated increase in write time. However, in the foregoing embodiment, it is necessary to control the power supply selection signal timing. However, for the arrangement of this additional embodiment, such a timing control is not needed, and further simplified. For this embodiment, the second type unit decoder is used.

In this embodiment, a pair of inverters 1001 and 1003 supply the unit decoder YDi' with the column decoder control signal $\phi$CL, /$\phi$CL. The supply voltage for inverter 1003 is provided from the sense amplifier activating signal supply line SLp.

A control signal $\phi$x is the input to the inverter 1001, which, in response to this input, outputs the column decoder control signal /$\phi$CL. This column decoder control signal /$\phi$CL is the input of the inverter 1003 as well as the gate electrode of a NMOS 301. Inverter 1003 outputs the column control signal $\phi$CL in response to /$\phi$CL.

This inverter 1003 includes a PMOS 1005 and a NMOS 1007. The gate electrodes of the PMOS 1005 and the NMOS 1007 are the input of the inverter. The drains of both are connected together at the output of the inverter 1003. The other electrode (the source) of the NMOS 1007 is connected to the ground potential Vss. The other electrode (the source) of the PMOS 1005 is connected to the sense amplifier activating supply line SLp. The inverter 1001 is a general type CMOS inverter powered by Vcc.

As is further described hereinbelow, this embodiment may be best understood with reference to the timing chart in FIG. 4 and the foregoing description.

The sense amplifier activating signal supply line SLp is precharged to Hvcc in the standby for the DRAM described herein just as for any typical DRAM. Thereafter, the word line is selected, the row selection signal is supplied to the word line, and a potential variation appears on the bit line pair based on the data stored in the selected memory cell. Then, when the sense amplifier control signal $\phi$SA is supplied, the potential of the sense amplifier activating signal supply line SLp is gradually charged from the potential HVcc toward the power supply potential Vcc. Thus, the potential level of the sense amplifier activating signal is gradually increased.

At this moment, the control signal $\phi$x is driven to a High level. In response, the column decoder control signal /$\phi$CL becomes a Low level and, a Low level signal is supplied to the input of the inverter 1003 which drives $\phi$CL high. Then, the high at $\phi$CL selects a desired column by the column decoder 103, and a column selection signal is supplied to the column line CLi of the selected column.

Since one electrode of the PMOS 1005 of the inverter 1003 is connected to the sense amplifier activating signal supply line SLp in this case, a driving potential V1' supplied to the inverter rises with the potential increase of the sense amplifier activating signal supply line SLp. Therefore, the potential level of the column selection signal supplied to the gates of the transfer gate TGi, /TGi gradually rises.

In the arrangement of this embodiment, the potential of the sense amplifier activating signal supply line SLp utimately rises nearly to the power supply potential Vcc. However, since the driving potential V1' is determined in correspondence with the potential variation of the sense amplifier activating signal for driving the sense amplifier which amplifies the potential difference between lines of the bit line pair, the arrangement of this embodiment also monitors the potential of the bit line, which is substantially equivalent to the foregoing embodiment.

That is, the timing at which the bit line is connected to the data bus is automatically set by the amplification rate of the potential of the bit line and the potential level of the column selection signal (the potential level of the column line). Further, even in for the above embodiments where a write operation time might increase, the driving potential V1' supplied to each unit decoder of the column decoders rises finally to the level of the power supply potential Vcc. Thus, this embodiment does not exhibit write time performance loss that might otherwise be encountered.

Furthermore, the arrangement of this embodiment includes additional considerations not encountered with the foregoing embodiments of the present invention.

In a semiconductor memory device including the second type unit decoder, the sense amplifier activating signal supply line SLp is connected to the inverter outputting the column decoder control signal φCL. Further, even in a case where a write operation time normally would be assumed to increase, as described above, the arrangement of this embodiment overcomes such a performance obstacle as described hereinabove.

Figure 11:
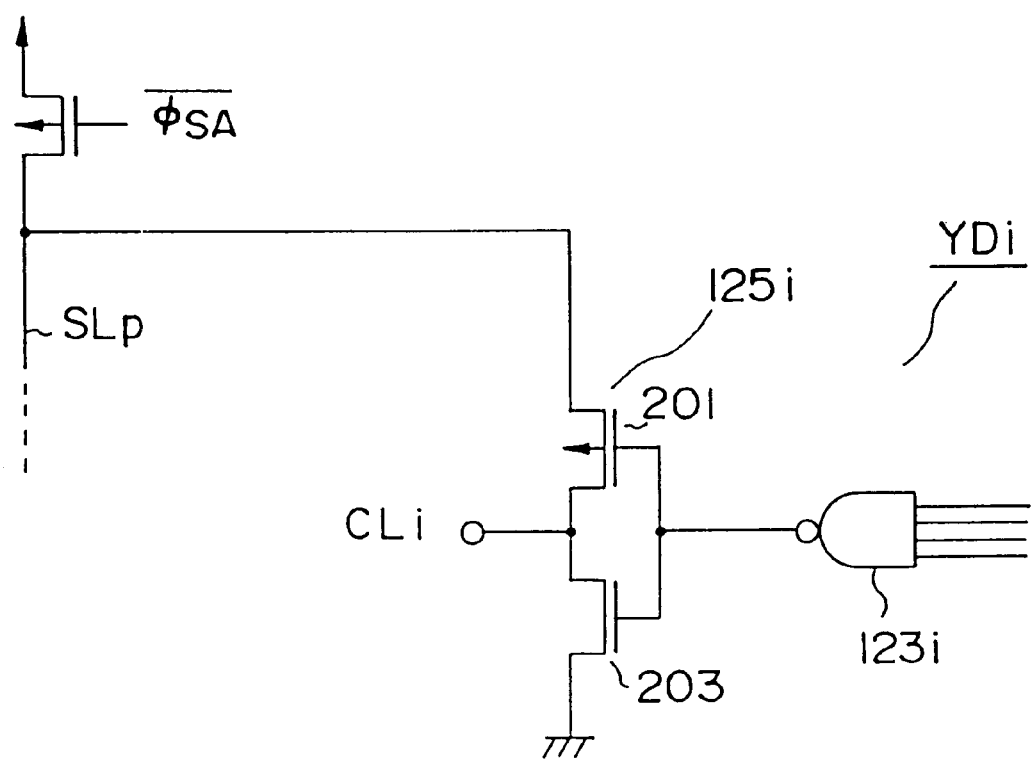
FIG. 11 is a circuit diagram partially illustrating still another embodiment of the present invention.

Although the description for this embodiment is with respect to the second type unit decoder, this second embodiment may be applied to the first type unit decoder as illustrated in FIG. 11.

In this variation, one electrode of the NMOS 201 of the first unit decoder is connected to the sense amplifier activating signal supply line SLp. Since operation of this variation is substantially the same as that of the variation of FIG. 10, circuit operation can be easily understood with reference to the above description of the operation of the variation of FIG. 10.

Accordingly, a DRAM circuit including the arrangement of this embodiment performs at high speed with reliable operation. This embodiment requires only a simple wiring change on a typical state of the art DRAM, connecting the sense amplifier activating signal supply line SLp to the drain of PMOS 201. Thus, this embodiment requires a very simple circuit layout modification to bring about a high quality circuit without substantially increasing the manufacturing process. This is more economically advantageous to semiconductor manufacturers.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

INDUSTRIAL APPLICABILITY

As described above, a semiconductor memory circuit with a high speed and reliable operation can be realized by applying the present invention to a semiconductor memory device. Further, a very simple design modification can realize the circuit arrangement, so that a high quality semiconductor memory device can be formed without sacrificing a higher integration and complicating the production process.

What is claimed is:

1. A memory circuit comprising:

a plurality of word lines;

a plurality of bit line pairs arrayed so as to intersect the word lines;

a plurality of memory cells connected at the intersections of the word lines and the bit line pairs, each of said memory cells storing data therein;

a sense amplifier for amplifying a potential of a line of the bit line pairs in response to a sense amplifier activating signal supplied from a sense amplifier activating signal supply line;

a row decoder for selecting a desired word line from the word lines in response to a row address signal;

a data bus;

a plurality of transfer transistors pairs, each transfer transistor pair being connected between one of the bit line pairs and the data bus, wherein one electrode of each transfer transistor is connected to a corresponding bit line pair line, another electrode of each transfer transistor is connected to a corresponding data bus line, and column selecting signals are supplied to control electrodes of each of the pairs of transfer transistors;

a column decoder for outputting the column selecting signals to the control electrodes of the transfer transistors in response to a column address signal; and a power supply potential for driving each element and a reference potential sufficiently lower than the power supply potential, the memory circuit characterized in that:

a first inverter having input and output terminals arrayed in an output part of the column decoder, wherein the first inverter consists of a first conductive MOS transistor having first and second electrodes and a first control electrode, and a second conductive MOS transistor having third and forth electrodes and a second control electrode, the first and second control electrode being connected to the input terminal, the first and third electrodes being connected to the output terminal, a driving potential supplied to the second electrode which is lower than the power supply potential, higher than the reference potential and wherein the driving potential is responsive to the sense amplifier activating signal supply line potential, and the reference potential is supplied to the forth electrodes.

2. A memory circuit as claimed in claim 1 wherein the second electrode is connected to an output of a second inverter, the second inverter consists of a third conductive MOS transistor having fifth and sixth electrodes and a fourth conductive MOS transistor having seventh and eighth electrodes, wherein the fifth and seventh electrodes are connected to the output of the second inverter, the sixth electrode is connected to the sense amplifier activating signal supply line, and the driving potential responds to a potential variation of the sense amplifier activating signal supply line when the reference potential is supplied to the eighth electrode.

3. A memory circuit comprising:

a word line;

a bit line arrayed so as to intersect the word line;

a memory cell connected at the intersection of the word line and the bit line, said memory cell storing data;

a row decoder for supplying a row selecting signal to the word line in response to a row address signal;

a data-bus;

a sense amplifier for amplifying a potential of the bit line in response to a sense amplifier activating signal supplied from a sense amplifier activating signal supply line;

a transfer transistor arrayed between the bit line and the data bus, wherein one electrode of the transfer transistor is connected to the bit line, the other electrode is connected to the data bus, and the control electrode thereof is provided with a column selecting signal;

a column decoder for outputting the column selecting signal to the control electrode of the transfer transistor in response to a column address signal; and a power supply potential for driving each element and a reference potential sufficiently lower than the power supply potential, the memory circuit characterized in that:

the transfer transistor turns on in response to a potential of the bit line whereby a potential of the column selecting signal supplied to the control electrode of the transfer transistor is set to a potential lower than the power supply potential and higher than the reference potential and wherein the potential of the column selecting signal is responsive to a potential of the sense amplifier activating signal supply line.

4. A memory circuit as claimed in claim 3 wherein the second electrode is connected to an output of a second inverter, the second inverter consists of a third conductive MOS transistor having fifth and sixth electrodes and a fourth conductive MOS transistor having seventh and eighth electrodes, wherein the fifth and seventh electrodes are connected to the output of the second inverter, the sixth electrode is connected to the sense amplifier activating signal supply line, and the driving potential responds to a potential variation of the sense amplifier activating signal supply line when the reference potential is supplied to the eighth electrode.

5. A memory circuit comprising:

a word line;

a bit line pair arrayed so as to intersect the word line;

a memory cell electrically connected at the intersection to said word line and said bit line pair;

a sense amplifier coupled to said bit line pair, the sense amplifier amplifying a potential difference on the bit line pair;

a first decoding circuit selecting said word line in response to first address information;

a data line pair;

a second decoding circuit selectively outputting a select signal from an output node in response to second address information, the second decoding circuit including an inverter, the inverter comprising a first transistor and a second transistor, the first transistor having a first conducting electrode selectively receiving a predetermined potential, a second conducting electrode electrically connected to said output node, and a gate electrode, said predetermined potential being a potential between a power supply potential and a reference potential and selectively supplied to at least one other memory circuit element, the second transistor having a first conducting electrode electrically connected to the output node, a second conducting electrode being supplied with said reference potential and a gate electrode; and a transfer circuit including a third transistor and fourth transistor, the third transistor electrically connected between one bit line of said bit line pair and one data line of said data line pair, the third transistor having a gate electrode receiving said select signal, and the fourth transistor electrically connected between another bit line of said bit line pair and another data line of said data line pair, the fourth transistor having a gate electrode receiving said select signal.

6. A memory circuit according to claim 5, said bit line pair being pre-charged to said predetermined potential from a precharge line, and said first conducting electrode of said first transistor connected to said precharge line.

7. A memory circuit according to claim 5, a first activating signal on a first activating signal line activating said second decoding circuit, and said activating signal line providing said predetermined potential to the first conducting electrode of said first transistor.

8. A memory circuit according to claim 7, said second decoding circuit further comprising:

a fifth transistor having a first conducting electrode electrically connected to said output node, a second conducting electrode being supplied with said reference potential, and a gate electrode receiving a complement of said activating signal.

9. A memory circuit according to claim 5, said sense amplifier being activated to amplify a potential difference of said bit line pair in response to a sense amp activating signal of said predetermined potential on an sense amp activating line, said sense amp activating line providing said predetermined potential to said first conducting electrode of said first transistor.

10. A memory circuit according to claim 5, said sense amplifier being activated to amplify a potential difference of said bit line pair in response to a sense amp activating signal of said predetermined potential on an sense amp activating line, and said memory circuit further comprising:

a control circuit electrically connected to said sense amp activating line and to said first conducting electrode of said first transistor; and a control signal, the control circuit selectively coupling said sense amp activating line or said reference potential to said first conducting electrode of said first transistor responsive to said control signal;

said second decoding circuit further comprising a fifth transistor having a first conducting electrode electrically connected to said output node, a second conducting electrode being supplied with said reference potential, and a gate electrode connected to the control signal.

11. A memory circuit according to claim 5, said memory circuit further comprising:

a potential select circuit coupled between said first conducting electrode of said first transistor and said predetermined potential, the potential select circuit selectively supplying said predetermined potential or said power supply potential to the first electrode of the first transistor responsive to a potential select signal.

12. A memory circuit according to claim 11, said potential select circuit selecting said predetermined potential for a data read operation in said memory circuit, and selecting said power supply potential for a data write operation in said memory circuit.

13. A memory circuit according to claim 5, wherein said predetermined potential is a potential between said power supply potential and said reference potential.

* * * * *